(12) United States Patent
Ruf et al.

(10) Patent No.: US 7,757,145 B2
(45) Date of Patent: Jul. 13, 2010

(54) TEST METHOD, INTEGRATED CIRCUIT AND TEST SYSTEM

(75) Inventors: Wolfgang Ruf, Friedberg (DE); Martin Schnell, Munich (DE)

(73) Assignee: Qimonda AG, Munich (DE)

( * ) Notice: Subject to any disclaimer, the term of this patent is extended or adjusted under 35 U.S.C. 154(b) by 287 days.

(21) Appl. No.: 12/050,706

(22) Filed: Mar. 18, 2008

(65) Prior Publication Data

US 2008/0288835 A1 Nov. 20, 2008

(30) Foreign Application Priority Data

Mar. 19, 2007 (DE) .................. 10 2007 013 075

(51) Int. Cl.
G11C 29/00 (2006.01)
G01R 31/28 (2006.01)
G01R 31/02 (2006.01)
G01R 31/26 (2006.01)

(52) U.S. Cl. .................. 714/744; 714/718; 714/730; 714/731; 714/742; 365/201; 324/763; 324/765

(58) Field of Classification Search .................. 714/744, 714/718, 730, 731, 742; 365/201; 324/763, 324/765
See application file for complete search history.

(56) References Cited

U.S. PATENT DOCUMENTS

| | | | |
|---|---|---|---|
| 6,442,727 B1 * | 8/2002 | Jones .................. 714/766 |
| 6,470,467 B2 * | 10/2002 | Tomishima et al. .......... 714/744 |
| 6,636,110 B1 * | 10/2003 | Ooishi et al. ................. 327/565 |
| 6,718,487 B1 * | 4/2004 | Sommer ...................... 714/42 |
| 6,807,505 B2 * | 10/2004 | De Jong et al. ............. 702/118 |
| 6,868,020 B2 * | 3/2005 | Aoki .......................... 365/200 |
| 6,894,945 B2 * | 5/2005 | Sawada .................. 365/233.11 |
| 6,993,696 B1 * | 1/2006 | Tanizaki et al. ............. 714/744 |
| 7,093,176 B2 * | 8/2006 | Nicolaidis et al. ........... 714/733 |
| 7,370,237 B2 * | 5/2008 | Kim et al. ..................... 714/30 |
| 7,457,177 B2 * | 11/2008 | Perry et al. .................. 365/201 |
| 2002/0048211 A1 | 4/2002 | Tsujino et al. |

OTHER PUBLICATIONS

Wu et al. Testing Logic-Intensive Memory ICs on Memory Testers, 1997, IEEE, pp. 50-54.*

* cited by examiner

*Primary Examiner*—John J Tabone, Jr.
(74) *Attorney, Agent, or Firm*—Coats & Bennett, P.L.L.C.

(57) ABSTRACT

The test method, integrated circuit and test system embodiments disclosed herein relate to testing at least one integrated circuit which uses an internal operating clock and has a first number of address pins, a second number of command pins and an address generation circuit which receives at least one encoded address information item using a third number of the address pins, which is smaller than the first number, and provides the other address pins as a fourth number of free address pins, where at least one first command is transferred using the command pins and at least one second command is transferred using at least one portion of the fourth number of the address pins from a test apparatus to the integrated circuit using a test clock which has a lower rate than the internal operating clock.

20 Claims, 5 Drawing Sheets

FIG 1

Provide an IC having a plurality of address pins, a plurality of command pins and an address generation circuit for receiving encoded address information from a test apparatus using a first subset of the plurality of address pins during a clock cycle of a test clock 

Transfer a first command from the test apparatus to the plurality of command pins of the IC and a second command from the test apparatus to a second different subset of the plurality of address pins of the IC during the clock cycle of the test clock, the test clock having a lower rate than the internal operating clock of the IC 

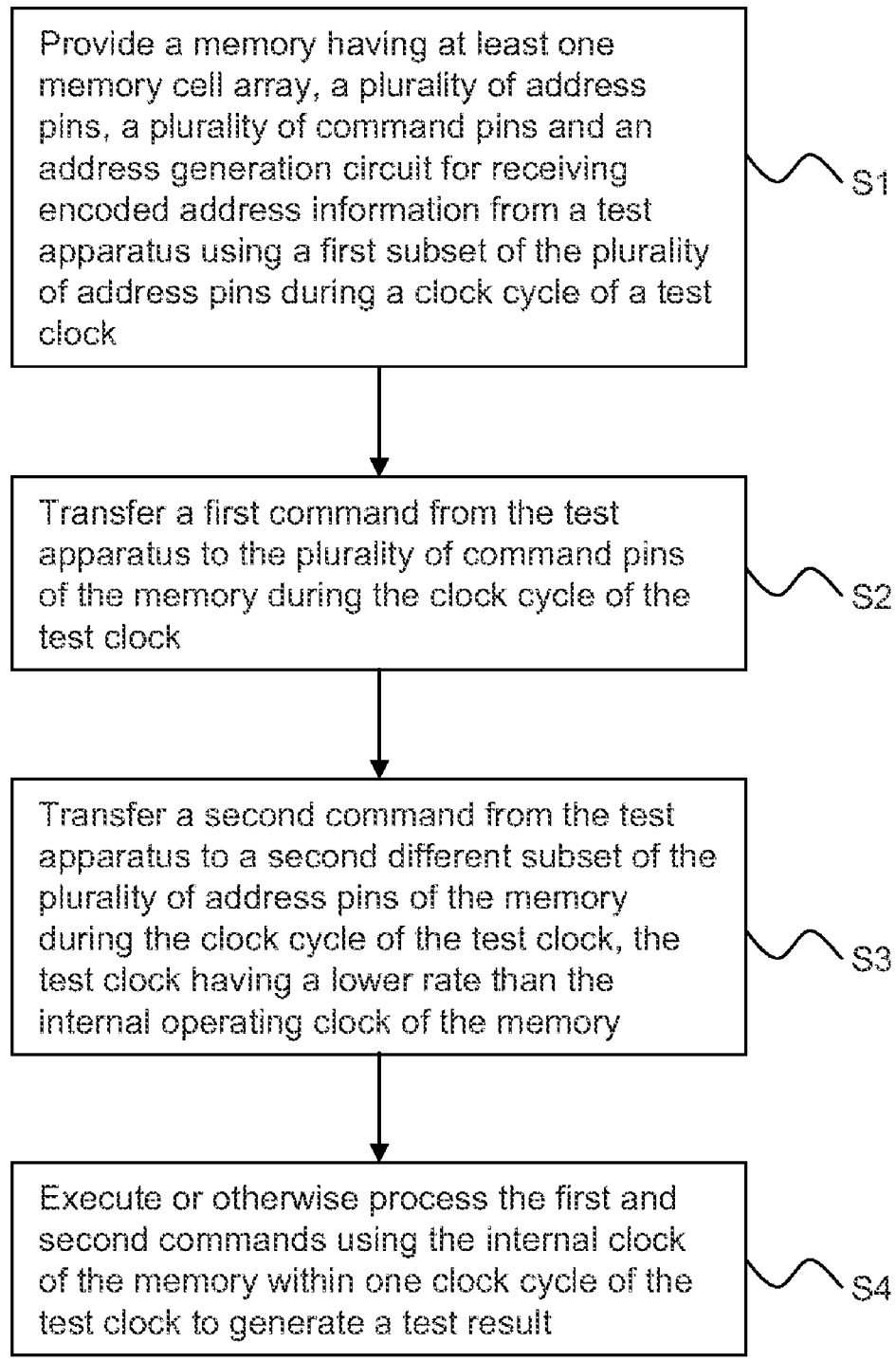

TEST METHOD, INTEGRATED CIRCUIT AND TEST SYSTEM

TECHNICAL BACKGROUND

Integrated circuits, for example memories, particularly integrated semiconductor memories, for example DRAMs (Dynamic Random Access Memory), semiconductor memories or flash memories, are subject to extensive function tests during and after their production in order to ensure the quality of the memories.

One such function test is what is known as the burn-in test. In a burn-in test of this kind, the memories or memory chips are stressed using increased voltages and/or increased temperatures in order to age the memories artificially, so that what is known as infant mortality is overcome.

Burn-in tests are usually tests over very long periods in large furnaces using a usually very low test clock rate, for example 5-10 MHz.

To increase the throughput of tested integrated circuits, for example memory chips, two approaches are conceivable in principle. A first approach relates to increasing the parallelism of the integrated circuits to be tested, for example memory chips, a second approach is based on reducing the test period or test times.

SUMMARY OF THE INVENTION

The invention proposes a test method for testing at least one integrated circuit which uses an internal operating clock and has a first number of address pins, a second number of command pins and an address generation circuit which receives at least one encoded address information item using a third number of the address pins, which is smaller than the first number, and provides the other address pins as a fourth number of free address pins, where at least one first command is transferred using the command pins and at least one second command is transferred using at least one portion of the fourth number of the address pins from a test apparatus to the integrated circuit using a test clock, which has a lower rate than the internal operating clock.

The invention also proposes an integrated circuit having a first number of address pins, a second number of command pins and an address generation circuit which receives at least one encoded address information item using a third number of the address pins, which is smaller than the first number, and provides the other address pins as a fourth number of free address pins, where the integrated circuit receives at least one first command using the command pins and at least one second command using at least one portion of the fourth number of the address pins from a test apparatus using a test clock, which has a lower rate than an internal operating clock in the integrated circuit.

In addition, the invention proposes a test system for testing at least one integrated circuit, having at least one integrated circuit which uses an internal operating clock and has a first number of address pins, a second number of command pins and an address generation circuit which receives an encoded address information item using a third number of the address pins, which is smaller than the first number, and provides the other address pins as a fourth number of free address pins, and having a test apparatus which transfers at least one first command via the command pins and at least one second command via at least one portion of the fourth number of the address pins to the integrated circuit using a test clock, which has a lower rate than the internal operating clock in the integrated circuit.

It is therefore possible for each clock cycle of the test clock prescribed by the test apparatus to involve not just one command for testing the integrated circuit but rather at least two commands being transferred and being executed by the integrated circuits. In this case, the first command(s) can be transferred via the predetermined command pins and the second command(s) can be transferred via at least one portion of the free address pins. This allows a significant reduction in the test time required for testing the integrated circuit. It goes without saying that a clock cycle of the test clock can also involve just one command being transferred to the integrated circuit and being executed by it.

Optionally, the transferred at least one first command and the transferred at least one second command are executed by the internal circuit using the internal clock within one clock cycle of the test clock.

In line with one exemplary embodiment, the integrated circuit has a memory circuit or a memory. For example, the memory may be a DRAM or an SPAM. Any desired type of memory circuit is possible.

In line with one exemplary embodiment, the integrated circuit has:

a memory with a memory cell array;

the first number of address pins;

a fifth number of clock pins for the purpose of the transferring the test clock;

a second number of command pins for the purpose of the transferring commands which are suitable for testing the memory;

a sixth number of data pins for the purpose of bidirectional transfer of data; and the address generation circuit, which receives at least the encoded address information item for at least one address for a command using the third number of address pins, generates at least the one address on the basis of the received at least one encoded address information item and provides the fourth number of free address pins.

In line with one exemplary embodiment, the invention proposes a method for testing at least one memory using a test apparatus which tests the respective memory using a test clock, where the method has the following steps:

(a) at least one memory is provided which uses an internal operating clock which has a higher rate than the test clock, where the memory has:

(a1) a memory cell array;

(a2) a first number of address pins at least for the purpose of receiving addresses;

(a3) a fifth number of clock pins for the purpose of receiving the test clock;

(a4) a second number of command pins for the purpose of transferring commands which are suitable for testing the memory;

(a5) a sixth number of data pins for the purpose of bidirectional transfer of data between the memory and the test apparatus; and (a6) an address generation circuit which receives at least one encoded address information item for at least one address for a command using a third number of address pins, which is smaller than the first number, generates at least the one address on the basis of the received at least one encoded address information item and provides a fourth number of free address pins;

(b) at least one first command is transferred from the test apparatus to the memory using the predetermined command pins in each clock cycle of the test clock;

(c) at least one second command is transferred from the test apparatus to the memory using at least one portion of the sixth number of the free address pins in each clock cycle of the test clock; and (d) the transferred at least one first command and the transferred at least one second command are executed using the internal clock within one clock cycle of the test clock for the purpose of providing a test result.

The method for testing can be used to test any memories, for example including DRAMs or flash memories.

It is therefore possible for each clock cycle of the test clock prescribed by the test apparatus to be able to involve not just one command for testing the memory but rather at least two commands being transferred and executed, with the first command(s) being transferred via the predetermined command pins and the second command(s) being transferred via at least one portion of the free address pins. If the internal clock is set to be twice as high as the test clock, for example, then each clock cycle of the test clock prescribed by the test apparatus involves two commands or test commands being transferred and processed, which means that there is a resultant increase in the throughput of commands or test commands of 100%. This allows a significant reduction in the test time required for testing the memory chip or memory. It goes without saying that a test cycle of the test clock may also involve just one command being transferred and processed.

In line with one exemplary embodiment, the address generation circuit has:

a row address counting circuit for incrementing or decrementing the respective X address;

a column address counting circuit for incrementing or decrementing the respective Y address;

a configuration register which stores data for at least two different test modes of operation; and at least one scrambler circuit for setting the configuration register and for selecting a respective predetermined test mode of operation.

The text below illustrates three examples of such a test mode of operation. A first example of the test mode of operation is a pure incrementing mode, in which the X address is incremented starting from the address 0. A second example of the test mode of operation is a pure decrementing mode, in which the X address is decremented from FFFF to 0. A third example of the test mode of operation is a modified incrementing mode, in which the X address is incremented from the address 0 in steps of two, that is to say 0, 2, 4, 6, . . . , to FFFE and then starting from 1 to FFFF.

In line with one exemplary embodiment, the integrated circuit is equipped with a data compression circuit which compresses at least one provided test result and reduces the number of necessary data pins for the purpose of outputting the test results. The data pins have driver functionalities, and therefore these data pins allow bidirectional communication between the test system and the respective integrated circuit. The test apparatus used for the function check has a limited number of tester channels. The compression of the test result and the associated reduction in the number of necessary data pins for the purpose of outputting the test results means that such a test apparatus can be used to test an increased number of integrated circuits, for example memories, in parallel. The use of a data compression circuit allows a memory or memory chip or integrated circuit to be operated internally in an x16 organizational form in order to increase the internal parallelism further and hence to save test time. This means that the test apparatus can be used to actuate or test a larger number of integrated circuits.

In line with one exemplary embodiment, at least one of the sixth number of the free address pins is used for the purpose of transferring a priority bit which indicates whether the memory executes the first command before the second command or the second command before the first command. It is therefore possible to determine the order of the commands to be executed in advance.

In line with one exemplary embodiment, the rate of the internal clock is N times higher than that of the test clock. In particular, N is equal to the number of commands transferred in one clock cycle of the test clock. By way of example, N=2, 4 or 8. Even if N only=2, the throughput of the commands executed per clock cycle of the test clock increases twofold.

In line with one exemplary embodiment, the integrated circuit has a frequency multiplication circuit which takes the received test clock as a basis for providing the N-times higher internal clock rate. In particular, the internal clock is determined by the external test clock and the number of commands transferred simultaneously in one clock cycle of the test clock.

In line with one exemplary embodiment, the integrated circuit has a memory cell array with a multiplicity of memory cell groups which respectively contain a plurality of memory cells and which can respectively be addressed via a word line and a column selection line for the purpose of reading the data stored in the memory cells in the memory cell group.

In line with one exemplary embodiment, the data compression circuit in the integrated circuit has a comparison circuit which compares the data read from an addressed memory cell group bit by bit with programmable test scheduled data, with the comparison circuit producing a logic pass/fail signal, which indicates whether all the data read from the addressed memory cell group match the test scheduled data, and producing a logic single-bit error signal or error indicator signal, which indicates whether the addressed memory cell group contains a single-bit error or a multibit error.

In line with one exemplary embodiment, the address generation circuit generates an X or Y address of the respective memory cell in each case by incrementing or decrementing the preceding X or Y address on the basis of the at least one received encoded address information item.

In line with one exemplary embodiment, a first command or a second command has three respective address pins used for it for the purpose of transferring the respective encoded address information item in one clock cycle of the test clock. In this case, a first address pin is used to transfer a first information item from the test apparatus to the integrated circuit to be tested, indicating whether the X or Y address is altered by the address generation circuit. A second address pin is used to transfer a second information item which indicates whether the address generation circuit increments or decrements the address denoted by the first information item. In addition, an at least third address pin is used to transfer a third information item which indicates the step size which the address generation circuit uses to increment or decrement the address denoted by the first information item. A plurality of third address pins can be used to produce a plurality of different step sizes. The address generation circuit is integrated in the integrated circuit, for example.

In line with one exemplary embodiment, the number of the first and second commands which are transferred in each clock cycle of the test clock from the test apparatus to the respective integrated circuit corresponds to a frequency multiplication factor N.

In line with one exemplary embodiment, the integrated circuit has at least two registers which respectively buffer-store at least one portion of a test result from the executed at least one first command and/or the executed at least one second command.

In line with one exemplary embodiment, at least one of the sixth number of the free address pins is used for the purpose of transferring a selection bit which indicates which register is read.

BRIEF DESCRIPTION OF THE FIGURES

The text below provides a more detailed explanation of the exemplary embodiments which are indicated in the schematic figures, in which:

FIG. 1 shows a schematic flowchart of a first exemplary embodiment of a test method;

FIG. 2 shows a schematic flowchart of a second exemplary embodiment of a test method;

In all the figures, elements and apparatuses which are the same or have the same function have been provided with the same reference symbols—unless stated otherwise.

DETAILED DESCRIPTION OF EMBODIMENTS

Figure 3:
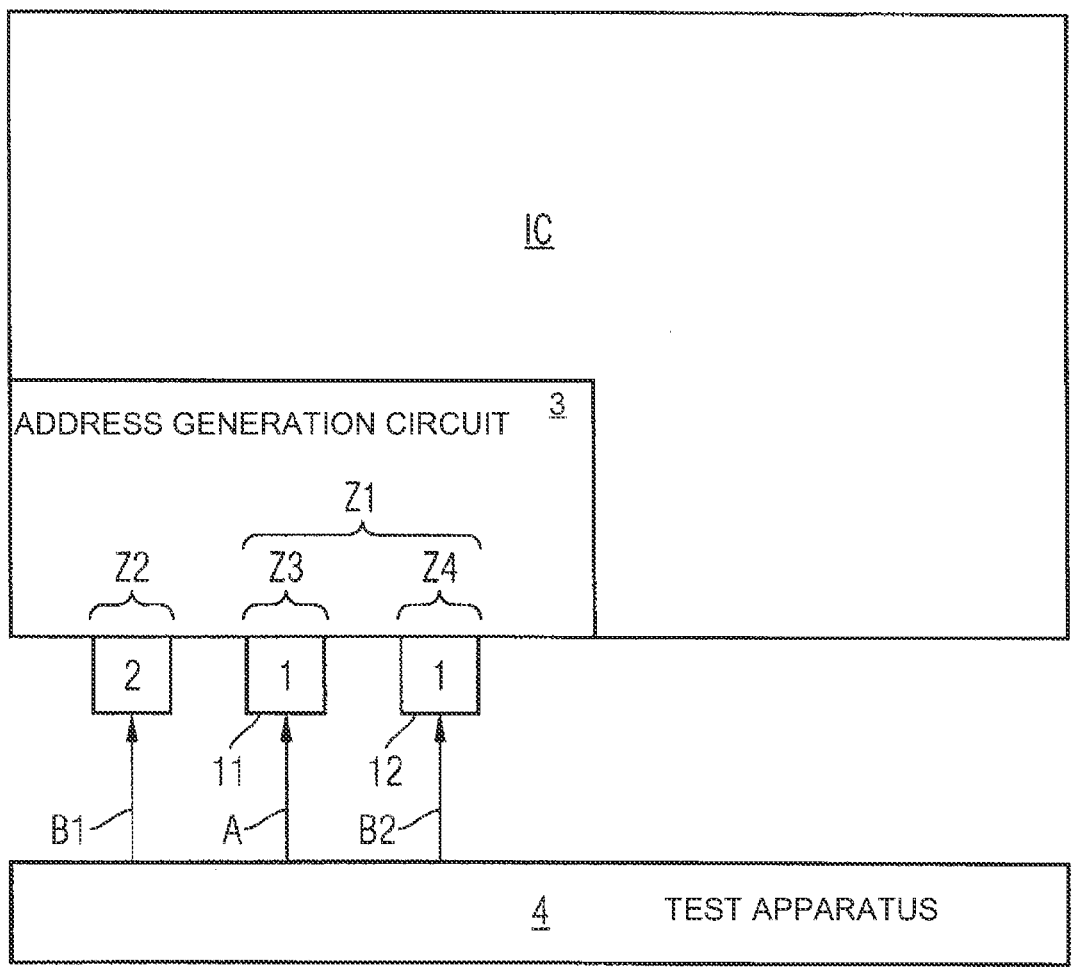
FIG. 3 shows a schematic block diagram of an exemplary embodiment of an integrated circuit.

FIG. 1 shows a schematic flowchart of an exemplary embodiment of a test method for testing an integrated circuit IC. The text below explains the test method with the aid of the flowchart in FIG. 1 with reference to the flow diagrams shown in FIGS. 3 to 5. The test method shown in FIG. 1 has the following method steps R1 and R2:

Method Step R1:

At least one integrated circuit IC is provided. The integrated circuit IC uses an internal operating clock T1. The integrated circuit IC has a first number Z1 of address pins 1, a second number Z2 of command pins 2 and an address generation circuit 3. The address generation circuit 3 receives at least one encoded address information item A using a third number Z3 of address pins 11, which is smaller than the first number Z1 of all the address pins 1. Hence, the address generation circuit 3 provides a fourth number Z4 of free address pins 12-14 (Z1=Z3+Z4).

The address of the memory cell 811, 812 on which the respective command B1, B2 is to be executed is formed on the basis of the encoded address information item A.

Method Step R2:

At least one first command B1 is transferred using the command pins 2 and at least one second command B2 is transferred using at least one portion of the fourth number Z4 of the address pins 12 from a test apparatus 4 to the integrated circuit IC using a test clock T2, which has a lower rate than the internal clock T1 in the integrated circuit IC.

Optionally, the transferred at least one first command B1 and the transferred at least one second command B2 can be executed by the integrated circuit IC using the internal operating clock T1 within one clock cycle of the test clock T2.

Figure 5:
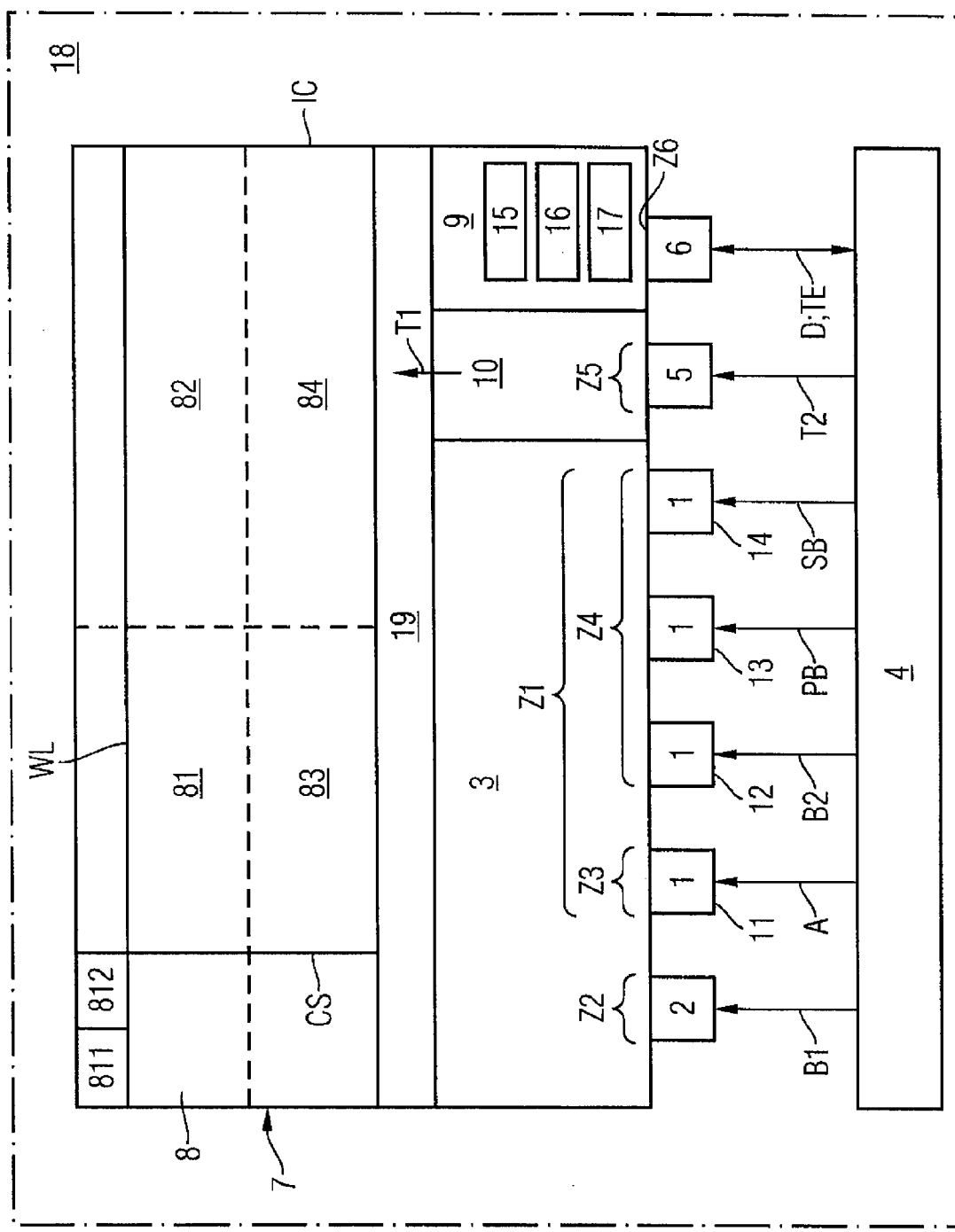
FIG. 5 shows a schematic block diagram of an exemplary embodiment of a test system.

By way of example, one of the fourth number Z4 of the free address pins 13 may also be used for the purpose of transferring a priority bit PB which indicates whether the integrated circuit IC executes the first command B1 before the second command B2 or the second command B2 before the first command B1 (see FIG. 5).

By way of example, the rate of the internal clock T1 may be N-times higher than that of the test clock T2, N being an integer number. By way of example, the number of the first and second commands B1, B2 which are transferred in each clock cycle of the test clock T2 from the test apparatus 4 to the integrated circuit IC may be equal to N.

FIG. 2 shows a schematic flow chart of a second exemplary embodiment of a test method for testing at least one integrated circuit IC. The text below explains the test method with the aid of a block diagram in FIG. 2 with reference to the block diagram in FIG. 5. The test method has the following method steps S1-S4:

Method Step S1:

At least one memory 7 is provided, for example within an arbitrary integrated circuit IC, which uses an internal operating clock T1, which has a higher rate than the test clock T2. The memory 7 has at least one memory cell array 8, a first number Z1 of address pins 1, a fifth number Z5 of clock pins 5, a second number Z2 of command pins 2, a sixth number Z6 of data pins 6 and an address generation circuit 3.

The memory cell array 8 optionally has a multiplicity of memory cell groups 81-84 which respectively contain a plurality of memory cells 811, 812. Without restricting the general nature, FIG. 5 shows only two memory cells 811 and 812 in the first memory cell group 81 in order to simplify illustration. The memory cell groups 81-84 can respectively be addressed via a word line WL and a column selection line CS (Column Select) for the purpose of reading the data D stored in the memory cells 811-812 in the memory cell group 81-84. Optionally, the rate of the internal clock T1 is N times higher than that of the test clock T2 in the test apparatus 4. For the purpose of generating the internal clock T1, the integrated circuit IC, which has the memory 7, optionally has a frequency multiplication circuit 10. The frequency multiplication circuit 10 can take the received test clock T2 as a basis for providing the N-times higher internal operating clock rate T1.

The first number Z1 of address pins 1 receives at least encoded address information A or addresses, particularly X and/or Y addresses. The clock pins 5 can be used for the purpose of transferring the test clock T2. The command pins 2 are suitable for receiving commands B1 which are suitable for testing the memory 7.

The data pins 6 are optionally suitable for the purpose of bidirectional transfer of data D between the integrated circuit 1 and the test apparatus 4. This may result particularly from the driver functionality of the data pins 6 or I/O pins.

The address generation circuit 3 is optionally designed such that it receives at least one encoded address information item A for at least one address for a command B1, B2 using a third number Z3 of address pins 11, which is smaller than the first number Z1, generates at least the one address on the basis of the received at least one encoded address information item A and provides a fourth number Z4 of free address pins 12-14. Optionally, the address generation circuit 3 can generate the X or Y address of the respective memory cell 811, 812 in each case by incrementing or decrementing the preceding X or Y address on the basis of the at least one received encoded address information item A.

Method Step S2:

At least one first command B1 or optionally a predetermined number of first commands B1 is/are transferred from the test apparatus 4 to the integrated circuit IC, particularly to the memory 7, using the predetermined command pins 2 in each clock cycle of the test clock T2.

Method Step S3:

At least one second command B2 or optionally a predetermined number of second commands B2 is/are transferred from the test apparatus 4 to the integrated circuit IC, particularly to the memory 7, using at least one portion of the fourth number Z4 of the address pins 12 in each clock cycle of the test clock T2.

Method Step S4:

The transferred at least one first command B1 and the transferred at least one second command B2, optionally the predetermined number of the transferred first commands B1 and the predetermined number of the transferred second commands B2, are executed or processed using the internal clock T1 within one clock cycle of the test clock T2 for the purpose of providing a test result TE. By way of example, the test clock T2 may be disposed in a range from 5-10 MHz and the internal clock T1 may be disposed in a range from 10 to several hundred MHz.

Optionally, at least one of the fourth number Z4 of the free address pins 13 is used for the purpose of transferring a priority bit PB which can indicate whether the integrated circuit IC executes or needs to execute the first command B1 before the second command B2 or the second command B2 before the first command B1.

Optionally, the integrated circuit IC may also have a data compression circuit 9 which can comprise at least one provided test result TE and can reduce the number of necessary data pins 6 for the purpose of outputting the test results TE. To this end, the data compression circuit 9 may have a comparison circuit 15, for example. The comparison circuit 15 can compare the data D read from an addressed memory cell group 81-84 bit by bit with programmable or predetermined scheduled data, with the comparison circuit 15 producing a logic pass/fail signal, which indicates whether all the data D read from the addressed memory cell group 81-84 match the test scheduled data, and producing a logic single-bit error signal, which indicates whether the addressed memory cell group 81-84 contains a single-bit error or a multibit error.

Optionally, the integrated circuit IC has at least two registers 16, 17 which can respectively buffer-store at least one portion of a test result TE from the executed at least one first command B1 and/or from the executed at least one second command B2. In this case, one of the fourth number Z4 of the free address pins 14 is optionally used for the purpose of transferring a selection bit SB which can indicate which register 16, 17 is read.

FIG. 3 shows a schematic block diagram of an exemplary embodiment of an integrated circuit IC. The integrated circuit IC may have a first number Z1 of address pins 1, a second number Z2 of command pins 2 and an address generation circuit 3. The address generation circuit 3 can receive at least one encoded address information item A using a third number Z3 of address pins 11, which is smaller than the first number Z1, and can provide a fourth number Z4 of free address pins 12. The integrated circuit IC is suitable for receiving at least one first command B1 using the command pins 2 and at least one second command B2 using at least one portion of the fourth number Z4 of the address pins 12 from a test apparatus 4 using a test clock T2.

Figure 4:
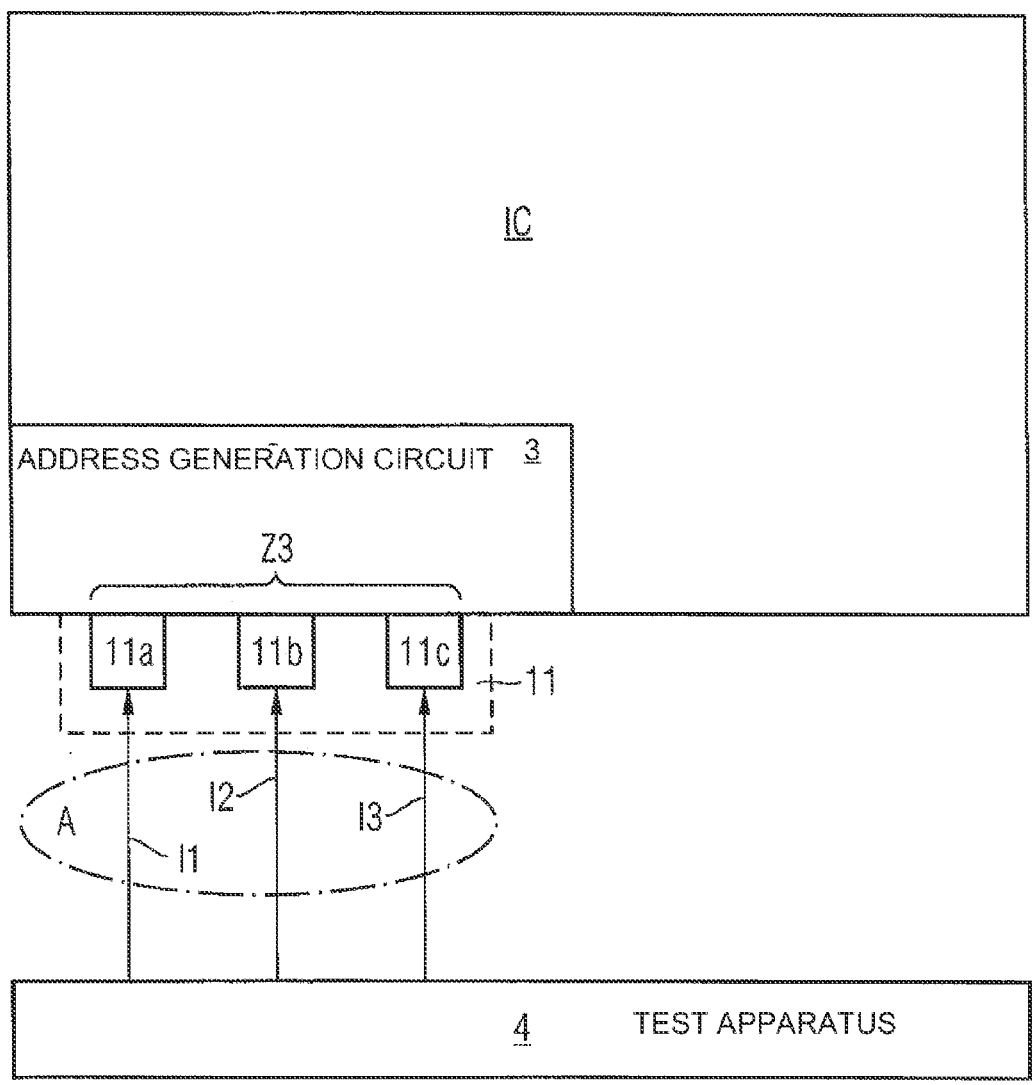
FIG. 4 shows a schematic block diagram of an exemplary embodiment of an integrated circuit with a detailed illustration of the address pins for the purpose of the transferring an encoded address information item as shown in FIG. 3.

FIG. 4 shows a schematic block diagram of an exemplary embodiment of the integrated circuit IC with a detailed illustration of the address pins 11 for the purpose of the transferring an encoded address information item A as shown in FIG. 3.

Optionally, a first command B or a second command B2 may have three respective address pins 11a, 11b, 11c used for it for the purpose of transferring the respective encoded address information item A in one clock cycle of the test clock T2. In this case, a first address pin 11a may be used to transfer a first information item I1 which can indicate whether the X or Y address is altered by the address generation circuit 3. In addition, a second address pin 11b can be used to transfer a second information item I2 which can indicate whether the address generation circuit 3 increments or decrements the address denoted by the first information item I1. In addition, at least one third address pin 11c may optionally be used to transfer a third information item I3 which can indicate the step size which the address generation circuit 3 uses to increment or decrement the address denoted by the first information item I1. The information items I1, I2 and I3 may therefore form at least one portion of the respective encoded address information item A.

FIG. 5 shows a block diagram of an exemplary embodiment of a test system 18. The test system 18 has at least one integrated circuit IC and a test apparatus 4. The integrated circuit IC uses an internal operating clock T1. In addition, the integrated circuit IC has a first number Z1 of address pins 1, a second number Z2 of command pins 2 and an address generation circuit 3, which is suitable for receiving an encoded address information item A using a third number Z3 of address pins 11, which is smaller than the first number Z1, and for providing the other address pins 1 as a fourth number Z4 of free address pins 12-14. 11 denotes the address pins 1 which are associated with the third number Z3 of the address pins 1 and which are used for the purpose of the transferring the encoded address information item A.

The test apparatus 4 can transfer at least one first command B1 via the command pins 2 and at least one second command B2 using at least one portion of the fourth number Z4 of the address pins 12 to the integrated circuit IC using a test clock T2. The test clock T2 has a lower rate than at least one internal operating clock T1 in the integrated circuit IC which the latter can use.

Optionally, the integrated circuit IC can execute the transferred at least one first command B1 and the transferred at least one second command B2 using its internal operating clock T1 within one clock cycle of the test clock T2 in the test apparatus 5.

Optionally, the integrated circuit IC has a memory 7. The integrated circuit IC can also be equipped with the memory 7, which optionally may have a memory cell array 8. In addition, the integrated circuit IC can be equipped with a first number Z1 of address pins 1, with a fifth number Z5 of clock pins 5 for the purpose of transferring the test clock T2, with a second number Z2 of command pins 2 for the purpose of transferring commands B1, B2 which are suitable for testing the memory 7, with a sixth number Z6 of data pins 6 for the purpose of directional transfer of data D and with the address generation circuit 3. The address generation circuit 3 receives at least the encoded address information item A for at least one address for the command B1, B2 using the third number Z3 of address pins 11, generates at least the one address on the basis of the received at least one encoded address information item A and provides the fourth number Z4 of free address pins 12-14.

Optionally, the integrated circuit IC can also be provided with a data compression circuit 9 which can compress at least one provided test result TE and can reduce the number of necessary data pins 6 for the purpose of outputting the test results TE. Optionally, at least one of the fourth number Z4 of the free address pins 13 can also be used for the purpose of transferring a priority bit PB which can indicate whether the integrated circuit IC executes the first command B1 before the second command B2 or the second command B2 before the first command B1.

Optionally, the internal operating clock T1 can be set such that its rate is N-times higher than that of the test clock T2. To this end, the integrated circuit IC may have a frequency multiplication circuit 10 which can take the received test clock T2 as a basis for providing the N-times higher internal clock rate T1.

Optionally, the memory cell array 8 can be equipped with a multiplicity of memory cell groups 81-84 which respectively contain a plurality of memory cells 811, 812 and which are respectively addressed via a word line WL and a column selection line CS for the purpose of reading the data D stored in the memory cells 811, 812 in the memory cell group 81-84. Without restricting the general nature and in order to simplify illustration, FIG. 5 shows only two memory cells 811, 812 in the first memory cell group 81.

Furthermore, the data compression circuit 9 may have a comparison circuit 15 which compares the data D read in an addressed memory cell group 81-84 bit by bit with programmable test scheduled data, with the comparison circuit 15 producing a logic pass/fail signal, which can indicate whether all the data D read from the addressed memory cell group 81-84 match the test scheduled data, and being able to produce a logic single-bit error signal, which can indicate whether the addressed memory cell group 81-84 contains a single-bit error or a multibit error.

Optionally, the address generation circuit 3 can generate the X or Y address of the respective memory cell 811, 812 in each case by incrementing or decrementing the preceding X or Y address on the basis of the at least one received encoded address information item A.

By way of example, the number of the first and second commands B1, B2 which are transferred in each clock cycle of the test clock T2 corresponds to a frequency multiplication factor N.

In addition, the integrated circuit IC may have at least two registers 16, 17 which can respectively buffer-store at least one portion of a test result TE from the executed at least one first command B1 or from the executed at least one second command B2.

By way of example, one of the fourth number Z4 of the free address pins 14 can also be used for the purpose of transferring a selection bit SB which can indicate which of the registers 16, 17 is read.

A logic circuit 18 in the integrated circuit IC is suitable for controlling the testing of the memory 7 and evaluating the test results TE or forwarding them to the data compression circuit 9.

Although the present invention has been described above with reference to the preferred exemplary embodiments, it is not limited thereto but rather may be modified in a wide variety of ways. By way of example, the memory in the exemplary embodiment shown in FIG. 5 may be in the form of any integrated circuit which is to be tested. The integrated circuit may also be any circuit which has at least one memory. However, the integrated circuit may also be an ASIC or an FPGA. In addition, the test method can be stored on any data storage medium or memory.

The invention claimed is:

1. A method for testing at least one integrated circuit which uses an internal operating clock and has a plurality of address pins, plurality of command pins and an address generation circuit configured to receive encoded address information using a a first subset of the plurality of address pins during testing of the integrated circuit, the method comprising:
    transferring a first command from a test apparatus to the plurality of command pins of the integrated circuit during a clock cycle of a test clock;
    transferring the encoded address information from the test apparatus to the first subset of the plurality of address pins of the integrated circuit during the clock cycle of the test clock;
    transferring a second command from the test apparatus to a second different subset of the plurality of address pins of the integrated circuit during the clock cycle of the test clock; and
    wherein the test clock has a lower rate than the internal operating clock.

2. The method according to claim 1, comprising executing the first command and the second command by the integrated circuit using the internal operating clock within one clock cycle of the test clock.

3. The method according to claim 2, wherein the integrated circuit comprises at least two registers configured to respectively buffer at least one portion of a test result from at least one of the executed first command and the executed second command.

4. The method according to claim 3, comprising transferring a selection bit from the test apparatus to a third different subset of the plurality of address pins of the integrated circuit, the selection bit configured to indicate which register should be read from.

5. The method according to claim 1, wherein the integrated circuit comprises at least one memory.

6. The method according to claim 1, comprising:
    compressing at least one provided test result; and
    reducing the number of data pins used to output the test results.

7. The method according to claim 1, comprising transferring a priority bit via a third different subset of the plurality of address pins, the priority bit configured to indicate whether the integrated circuit should execute the first command before the second command or the second command before the first command.

8. The method according to claim 1, wherein the rate of the internal operating clock is N times higher than that of the test clock, N being a positive integer.

9. The method according to claim 8, comprising using the test clock as a basis to provide the N-times higher internal operating clock rate.

10. The method according to claim 1, wherein the integrated circuit comprises a memory with a memory cell array, one or more clock pins and a plurality of data pins.

11. The method according to claim 10, comprising:
    transferring the test clock from the test apparatus to the one or more clock pins of the integrated circuit;
    transferring commands configured to test the memory from the test apparatus to the plurality of command pins of the integrated circuit; transferring bi-directional data between the test apparatus and the plurality of data pins of the integrated circuit;
    receiving at least the encoded address information for at least one address for a command using the first subset of address pins; and generating at least the one address on the basis of the received encoded address information.

12. The method according to claim 10, wherein the memory cell array comprises a plurality of memory cell groups each having a plurality of memory cells which are respectively addressed via a word line and a column selection line for the purpose of reading data stored in the memory cells in the memory cell group.

13. The method according to claim 12, further comprising:
comparing data read from an addressed memory cell group bit by bit with programmable test scheduled data;
producing a logic pass/fail signal configured to indicate whether the data read from the addressed memory cell group matches the test scheduled data; and
producing a logic single-bit error signal configured to indicate whether the respective addressed memory cell group has a single-bit error or a multi-bit error.

14. The method according to claim 10, comprising incrementing or decrementing a preceding row or column address based on the encoded address information.

15. The method according to claim 14, comprising:
transferring the encoded address information item in one clock cycle of the test clock from the test apparatus to at least three of the plurality of address pins of the integrated circuit;
receiving a first information item at the first address pin which indicates whether the row or column address is altered;
receiving a second information item at the second address pin which indicates whether an address denoted by the first information item should be incremented or decremented; and
receiving a third information item at the third address pin which indicates a step size used to increment or decrement the address denoted by the first information item.

16. The method according to claim 1, wherein the rate of the internal operating clock is N times higher than that of the test clock, N being equal to the number of commands transferred to the integrated circuit during the clock cycle of the test clock.

17. An integrated circuit comprising:
plurality of address pins;
plurality of command pins;
an address generation circuit configured to receive encoded address information using a first subset of the plurality of address pins during testing of the integrated circuit; and
wherein the integrated circuit is configured to receive a first command using the plurality of command pins during a clock cycle of a test clock, receive the encoded address information using the first subset of the plurality of address pins during the clock cycle of the test clock and receive a second command using a second different subset of the plurality of address pins during the clock cycle of the test clock, the test clock having a lower rate than an internal operating clock of the integrated circuit.

18. The integrated circuit according to claim 17, wherein the integrated circuit comprises at least one memory.

19. The integrated circuit according to claim 17, wherein the integrated circuit comprises:
a memory with a memory cell array;
one or more clock pins configured to receive the test clock;
a plurality of data pins configured to transfer bidirectional data;
wherein the plurality of command pins are configured to receive commands suitable for testing the memory; and
wherein the address generation circuit is configured to receive at least the encoded address information for at least one address for a command using the first subset of address pins, generate at least the one address on the basis of the received encoded address information and provide the second subset of address pins.

20. A test system for testing at least one integrated circuit comprising:
at least one integrated circuit comprising plurality of address pins, a plurality of command pins and an address generation circuit configured to receive encoded address information using a a first subset of the plurality of address pins during testing of the integrated circuit; and
a test apparatus configured to transfer a first command via the plurality of command pins, the encoded address information via the first subset of the plurality of address pins and a second command via a second different subset of the plurality of address pins to the integrated circuit during a clock cycle of a test clock, the test clock having a lower rate than an internal operating clock of the integrated circuit.

* * * * *